US012188880B2

United States Patent
Mori et al.

(10) Patent No.: US 12,188,880 B2
(45) Date of Patent: Jan. 7, 2025

(54) METHOD OF CALIBRATING COORDINATE POSITION IDENTIFICATION ACCURACY OF LASER SURFACE INSPECTION APPARATUS AND METHOD OF EVALUATING SEMICONDUCTOR WAFER

(71) Applicant: SUMCO CORPORATION, Tokyo (JP)

(72) Inventors: Keiichiro Mori, Saga (JP); Takahiro Nagasawa, Saga (JP)

(73) Assignee: SUMCO CORPORATION, Tokyo (JP)

( * ) Notice: Subject to any disclaimer, the term of this patent is extended or adjusted under 35 U.S.C. 154(b) by 263 days.

(21) Appl. No.: 17/774,761

(22) PCT Filed: Oct. 6, 2020

(86) PCT No.: PCT/JP2020/037787
§ 371 (c)(1),
(2) Date: May 5, 2022

(87) PCT Pub. No.: WO2021/090624
PCT Pub. Date: May 14, 2021

(65) Prior Publication Data
US 2022/0373478 A1    Nov. 24, 2022

(30) Foreign Application Priority Data

Nov. 7, 2019 (JP) .................. 2019-202182

(51) Int. Cl.
*G01N 21/95* (2006.01)
*G01N 21/956* (2006.01)
*H01L 21/66* (2006.01)

(52) U.S. Cl.
CPC ... *G01N 21/9501* (2013.01); *G01N 21/95684* (2013.01); *H01L 22/12* (2013.01)

(58) Field of Classification Search
CPC ........ G01N 21/9501; G01N 21/95684; G01N 21/93; G01N 21/956; H01L 22/12; G01B 21/042
See application file for complete search history.

(56) References Cited

U.S. PATENT DOCUMENTS 6,124,142 A    9/2000 Fujino et al.
6,535,781 B1   3/2003 Tsutsumi
(Continued)

FOREIGN PATENT DOCUMENTS

CN    103531500    1/2014
CN    107615469    1/2018
(Continued)

OTHER PUBLICATIONS

Office Action issued in Corresponding JP Patent Application No. 2019-202182, dated Sep. 6, 2022, along with an English translation thereof.
(Continued)

*Primary Examiner* — Tri T Ton
(74) *Attorney, Agent, or Firm* — Greenblum & Bernstein, P.L.C.

(57) ABSTRACT

The method includes detecting a COP in a surface of a reference wafer with a laser surface inspection apparatus to be calibrated and an apparatus for calibration that obtains an X coordinate position and a Y coordinate position of the COP; determining a COP that is detected as the same COP with a determination criterion that a positional difference between a detected position obtained by the laser surface inspection apparatus to be calibrated and a detected position obtained by the apparatus for calibration on the reference wafer surface is within a threshold range; and calibrating the coordinate position identification accuracy of the laser surface inspection apparatus to be calibrated by adopting the X and Y coordinate positions obtained by the apparatus for
(Continued)

calibration as true values of the X and Y coordinate positions.

5 Claims, 3 Drawing Sheets

(56) References Cited

U.S. PATENT DOCUMENTS

| | | | |
|---|---|---|---|
| 9,633,913 | B2 | 4/2017 | Mori |
| 9,835,567 | B2 | 12/2017 | Laube |
| 10,261,125 | B2 | 4/2019 | Nagasawa et al. |
| 10,422,756 | B2 | 9/2019 | Mori |
| 10,718,720 | B2 | 7/2020 | Mori |
| 2018/0136143 | A1* | 5/2018 | Kato ............... H01L 22/00 |
| 2019/0279890 | A1 | 9/2019 | Mori |
| 2020/0411391 | A1 | 12/2020 | Nagasawa et al. |
| 2022/0102225 | A1 | 3/2022 | Nagasawa et al. |

FOREIGN PATENT DOCUMENTS

| | | |
|---|---|---|
| CN | 109141223 | 1/2019 |
| JP | H08220005 A * | 8/1996 |
| JP | 2000-222575 A | 8/2000 |
| JP | 2005-43277 | 2/2005 |
| JP | 2006-210571 | 8/2006 |
| JP | 2015-069678 A | 4/2015 |
| JP | 2016-039374 A | 3/2016 |
| JP | 2018-006658 A | 1/2018 |

OTHER PUBLICATIONS

International Preliminary Report on Patentability Issued in Corresponding International Application No. PCT/JP2020/037787, dated May 19, 2022, along with an English translation thereof.
International Search Report issued in International Bureau of Wipo Patent Application No. PCT/JP2020/037787, dated Dec. 22, 2020, along with an English translation thereof.
Office Action issued in Corresponding CN Patent Application No. 202080067879.5, dated Mar. 21, 2024, along with an English translation thereof.

* cited by examiner

X direction coordinate deviation [μm]

Y direction coordinate deviation [μm]

METHOD OF CALIBRATING COORDINATE POSITION IDENTIFICATION ACCURACY OF LASER SURFACE INSPECTION APPARATUS AND METHOD OF EVALUATING SEMICONDUCTOR WAFER

CROSS-REFERENCE TO RELATED APPLICATIONS

This application claims the benefit of priority to Japanese Patent Application No. 2019-202182 filed on Nov. 7, 2019, which is expressly incorporated herein by reference in its entirety.

TECHNICAL FIELD

The present invention relates to a method of calibrating a coordinate position identification accuracy of a laser surface inspection apparatus and a method of evaluating a semiconductor wafer.

BACKGROUND ART

As a method of evaluating defects of a semiconductor wafer and/or foreign matter adhering to the surface, a method based on light point defects (LPDs) detected by a laser surface inspection apparatus is widely used (for example, refer to Japanese Patent Application Publication No. 2016-39374 and Japanese Patent Application Publication No. 2018-6658, which are expressly incorporated herein by reference in their entirety). In this evaluation method, light is incident on the surface of the semiconductor wafer to be evaluated, and the radiation light (scattered light and reflected light) from this surface is detected to evaluate the presence or absence and/or the sizes of defects and foreign matter on the semiconductor wafer.

SUMMARY OF INVENTION

Defects of a semiconductor wafer and/or foreign matter adhering to the surface affect the characteristics of the devices manufactured using the semiconductor wafer as the substrate. Therefore, to provide devices with satisfactory characteristics, it is desirable that the defects and/or foreign matter adhering to the surface detected as LPDs with a laser surface inspection apparatus be morphologically observed using an apparatus equipped with a microscope so as to identify the causes based on the observation result. However, since the observation field of a microscope is normally several hundred nm to several tens of μm, when the LPD detection accuracy of the laser surface inspection apparatus is low, the LPD to be observed can be outside the field of view of the microscope, or an LPD different from the observation target can be observed with the microscope, making it difficult to morphologically observe the LPDs that should be observed.

In view of the above, it is an objective of one aspect of the present invention to provide a new means for improving the LPD detection accuracy of a laser surface inspection apparatus.

One aspect of the present invention relates to
a method of calibrating a coordinate position identification accuracy of a laser surface inspection apparatus that detects LPDs of a semiconductor wafer surface by scanning the wafer surface with incident laser light while rotating the semiconductor wafer (hereinafter, also referred to simply as "calibration method"), the method including:

detecting a crystal originated particle (COP) in a surface of a reference wafer with each of a laser surface inspection apparatus to be calibrated and an apparatus for calibration that obtains an X coordinate position and a Y coordinate position of the COP with a two-dimensional Cartesian coordinate system;

determining a COP that is detected as the same COP by the laser surface inspection apparatus to be calibrated and the apparatus for calibration with a determination criterion that a positional difference between a detected position obtained by the laser surface inspection apparatus to be calibrated and a detected position obtained by the apparatus for calibration on the reference wafer surface is within a threshold range for determining whether the COP detected respectively by the apparatuses is the same COP; and calibrating the coordinate position identification accuracy of the laser surface inspection apparatus to be calibrated by adopting the X coordinate position and the Y coordinate position obtained by the apparatus for calibration as true values of the X coordinate position and the Y coordinate position of the COP that is determined to be the same COP.

Japanese Patent Application Publication No. 2016-39374 and Japanese Patent Application Publication No. 2018-6658 described above do not disclose that the coordinate positions of LPDs identified by a laser surface inspection apparatus should be calibrated.

In this respect, through repeated studies, the present inventors have found that although a laser surface inspection apparatus has the advantage of being able to quickly detect LPDs of a semiconductor wafer surface by scanning the wafer surface with incident laser light while rotating the semiconductor wafer, the detected positions of LPDs obtained by the laser surface inspection apparatus can deviate significantly in the wafer rotation direction (circumferential direction), that is, the accuracy of identifying the positions of LPDs is low. The present inventors assumed that this is the cause of the low accuracy of LPDs detection of the laser surface inspection apparatus and, as a result of further diligent studies, newly found the above calibration method that includes calibrating the coordinate positions of LPDs identified by the laser surface inspection apparatus using, as the apparatus for calibration, an apparatus that uses a two-dimensional Cartesian coordinate system.

In one embodiment, when the positional deviation amount obtained by following Expression 1:

$$\text{Positional deviation amount} = \sqrt{(X_2 - X_1)^2 + (Y_2 - Y_1)^2} \quad \text{(Expression 1)}$$

is less than or equal to a threshold value, it can be determined that the above positional difference is within the threshold range. In Expression 1, $X_1$ and $Y_1$ represent the X coordinate position and the Y coordinate position of the detected position detected by the apparatus for calibration, and $X_2$ and $Y_2$ represent the X coordinate position and the Y coordinate position of the detected position detected by the laser surface inspection apparatus to be calibrated.

In one embodiment, the apparatus for calibration can be a surface defect inspection apparatus equipped with a confocal laser scanning microscope.

In one embodiment, the above-mentioned calibration of the coordinate position identification accuracy can include determining correction values for the X coordinate position and the Y coordinate position of the detected position detected by the laser surface inspection apparatus to be calibrated.

One aspect of the present invention relates to a semiconductor wafer evaluation method (hereinafter, also referred to simply as "evaluation method") including:
calibrating, by the above calibration method, a coordinate position identification accuracy of a laser surface inspection apparatus that detects LPDs of a semiconductor wafer surface by scanning the wafer surface with incident laser light while rotating the semiconductor wafer;
detecting, with the laser surface inspection apparatus after the calibration, an LPD of the semiconductor wafer surface to be evaluated by scanning the wafer surface with incident laser light while rotating the semiconductor wafer to be evaluated; and
performing morphological observation on the detected LPD with a microscope,
wherein the X coordinate position and the Y coordinate position determined by the laser surface inspection apparatus after the calibration are adopted in determining the observation position of the morphological observation.

In one embodiment, the microscope can be an atomic force microscope or a scanning electron microscope.

According to one aspect of the present invention, it is possible to improve the LPD coordinate position identification accuracy of a laser surface inspection apparatus. This can also facilitate the morphological observation of defects and/or foreign matter detected as LPDs with a microscope.

DESCRIPTION OF EMBODIMENTS

Figure 1:
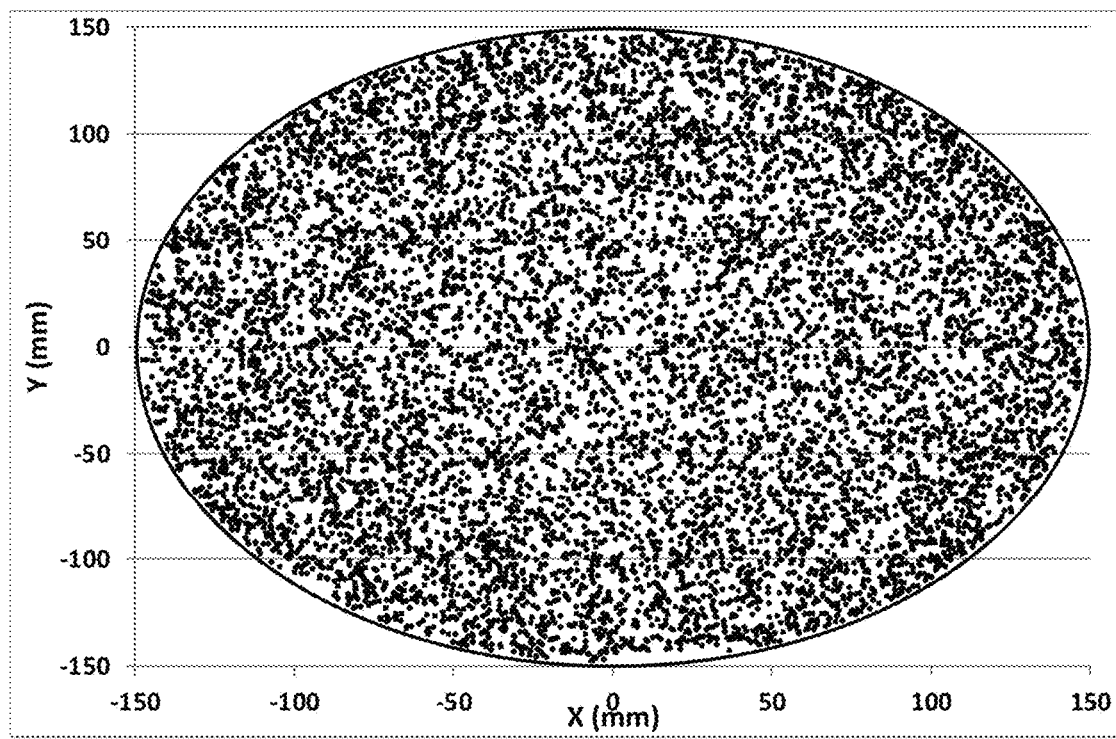
FIG. 1 shows the in-plane distribution of the COPs determined to be the same COPs with Surfscan series SP5 manufactured by KLA TENCOR and MAGICS (M5640) manufactured by Lasertec Corporation.

[Method of Calibrating Coordinate Position Identification Accuracy of Laser Surface Inspection Apparatus]

One aspect of the present invention relates to a method of calibrating a coordinate position identification accuracy of a laser surface inspection apparatus that detects LPDs of a semiconductor wafer surface by scanning the wafer surface with incident laser light while rotating the semiconductor wafer, the method including: detecting a COP in a surface of a reference wafer with each of a laser surface inspection apparatus to be calibrated and an apparatus for calibration that obtains an X coordinate positions and a Y coordinate positions of the COP with a two-dimensional Cartesian coordinate system (hereinafter also referred to as "COP detection step"); determining a COP that is detected as the same COP by the laser surface inspection apparatus to be calibrated and the apparatus for calibration with a determination criterion that a positional difference between a detected position obtained by the laser surface inspection apparatus to be calibrated and a detected position obtained by the apparatus for calibration on the reference wafer surface is within a threshold range for determining whether the COP detected respectively by the apparatuses is the same COP (hereinafter also referred to as "same COP determination step"); and calibrating the coordinate position identification accuracy of the laser surface inspection apparatus to be calibrated by adopting the X coordinate position and the Y coordinate position obtained by the apparatus for calibration as true values of the X coordinate position and the Y coordinate position of the COP that is determined to be the same COP (hereinafter also referred to as "calibration step").

The above calibration method is described in more detail below.

<Laser Surface Inspection Apparatus to be Calibrated>

The apparatus whose coordinate position identification accuracy is to be calibrated by the above calibration method is a laser surface inspection apparatus that detects LPDs of a semiconductor wafer surface by scanning the wafer surface with incident laser light while rotating the semiconductor wafer. Such a laser surface inspection apparatus can be a laser surface inspection apparatus with a known configuration, which is also referred to as a light-scattering surface inspection apparatus, a surface inspection apparatus, a particle counter, or the like. The laser surface inspection apparatus normally scans the surface of a semiconductor wafer to be evaluated with laser light, and detects defects and/or foreign matter on the wafer surface as LPDs based on the radiation light (scattered light or reflected light). Also, by measuring the radiation light from LPDs, the sizes and/or positions of the defects and/or foreign matter can be identified. As the laser light, ultraviolet light, visible light, and the like can be used, and there is no limitation to the wavelength thereof. Ultraviolet light is light of a wavelength range of less than 400 nm, and visible light is light of a wavelength range of 400 to 600 nm. The analysis portion of the laser surface inspection apparatus normally uses a correlation equation between the size of a standard particle and the size of an LPD caused by the standard particle to covert the size of an LPD detected by the laser surface inspection apparatus into the size of the defect or foreign matter. The analysis portion that performs such conversion normally includes a personal computer (PC) with conversion software, and the configuration of the analysis portion is known. Specific examples of commercially available laser surface inspection apparatuses include Surfscan series SP1, SP2, SP3, and SP5 manufactured by KLA TENCOR. However, these apparatuses are examples, and other laser surface inspection apparatuses can also be used. A laser surface inspection apparatus normally uses a polar coordinate system as the coordinate system for determining the positions of defects and/or foreign matter detected as LPDs, and the positions determined using the polar coordinate system are converted into a two-dimensional Cartesian coordinate system to obtain the X coordinate positions and the Y coordinate positions of the LPDs.

<Apparatus for Calibration>

The laser surface inspection apparatus identifies LPDs based on the information obtained while rotating the semiconductor wafer. This can increase the deviation of the coordinate positions of the detected LPDs particularly in the wafer rotation direction, that is, the circumferential direction, as described above. In contrast, the above calibration method uses, as an apparatus for calibration, an apparatus that obtains the positions, that is, the X coordinate positions and the Y coordinate positions, of the detected defects and/or foreign matter with a two-dimensional Cartesian coordinate system. In the present invention and the present specification, the "apparatus that obtains an X coordinate position and a Y coordinate position with a two-dimensional Cartesian coordinate system" and the "apparatus that uses a two-dimensional Cartesian coordinate system" refer to an apparatus that obtains an X coordinate position and a Y coordinate position with a two-dimensional Cartesian coordinate system without performing conversion from another coordinate system. By calibrating the coordinate position identification accuracy of the laser surface inspection apparatus to be calibrated using an apparatus for calibration that uses a two-dimensional Cartesian coordinate system as described above, the LPD detection accuracy, specifically the LPD position identification accuracy, of the laser surface inspection apparatus can be improved.

As the apparatus for calibration, various types of apparatuses that use a two-dimensional Cartesian coordinate system can be used. Specific examples include a surface defect inspection apparatus equipped with a confocal laser scanning microscope, an atomic force microscope (AFM), and a scanning electron microscope (SEM). A surface defect inspection apparatus equipped with a confocal laser scanning microscope is preferably used as the apparatus for calibration because it can scan an area equivalent to that of the laser surface inspection apparatus to be calibrated. Specific examples of a surface defect inspection apparatus equipped with a confocal laser scanning microscope include a wafer defect inspection/review apparatus MAGICS manufactured by Lasertec Corporation.

<Reference Wafer>

To calibrate the coordinate position identification accuracy of the laser surface inspection apparatus to be calibrated, the above calibration method uses, as a reference wafer, a wafer having COP(s) in its surface. A COP generally has a size of about 10 nm to several hundred nm (for example, about 10 nm to 500 nm) and can be detected as one LPD with a laser surface inspection apparatus. Also, various types of apparatuses that can be used as the apparatus for calibration, such as a surface defect inspection apparatus equipped with a confocal laser scanning microscope, can also detect a COP as one LPD. Furthermore, COPs are suitable since they are cavity defects and, unlike particles, do not involve the concern of contaminating the apparatus by creating dust. The reference wafer can be a semiconductor wafer such as a silicon wafer, and a known method can be used as a manufacturing method thereof. For example, Japanese Patent Application Publication No. 2018-6658 discloses a manufacturing method in paragraphs 0031 to 0049 and FIGS. 1 and 2.

Next, the "COP detection step", the "same COP determination step", and the "calibration step" in the above calibration method are described.

<COP Detection Step>

In the COP detection step, the laser surface inspection apparatus to be calibrated and the apparatus for calibration each detect COP(s) in the same reference wafer surface. For COP detection, each apparatus can use the measurement conditions that are normally adopted for detecting defects and foreign matter.

<Same COP Determination Step>

As described above, the deviation of the coordinate positions obtained by the laser surface inspection apparatus is expected to be large, and the coordinate position obtained by the laser surface inspection apparatus and the coordinate position obtained by the apparatus for calibration using a two-dimensional Cartesian coordinate system for the same single COP are normally different. In the above calibration method, to adopt the coordinate position obtained by the apparatus for calibration as true values, among the COPs detected by the laser surface inspection apparatus to be calibrated, the COP, that is determined to be the same COP as the COP detected by the apparatus for calibration, is determined (same COP determination step).

The same COP determination step determines a COP that is detected as the same COP by the laser surface inspection apparatus to be calibrated and the apparatus for calibration with a determination criterion that the positional difference between a detected position obtained by the laser surface inspection apparatus to be calibrated and a detected position obtained by the apparatus for calibration on the reference wafer surface is within a threshold range for determining whether the COP detected respectively by the apparatuses is the same COP.

In one embodiment, the positional deviation amount obtained by following Expression 1:

$$\text{Positional deviation amount} = \sqrt{(X_2-X_1)^2 + (Y_2-Y_1)^2} \quad \text{(Expression 1)}$$

can be used as the index of the positional difference. Specifically, when the positional deviation amount obtained by Expression 1 is less than or equal to the threshold value, it can be determined that COPs detected by the above apparatuses are the same COP. In Expression 1, $X_1$ and $Y_1$ represent the X coordinate position and the Y coordinate position obtained by the apparatus for calibration, and $X_2$ and $Y_2$ represent the X coordinate position and the Y coordinate position obtained by the laser surface inspection apparatus to be calibrated. This also applies to $X_1$, $Y_1$, $X_2$, and $Y_2$ described below. The threshold value of the positional deviation amount can be set in the range of about 10 µm to 300 µm, for example. However, the threshold value of the positional deviation amount can be selected taking into consideration the coordinate position identification accuracy of the apparatus to be used and the like, and is not limited to the exemplified range above. The determination of the same COP based on the threshold value of the positional deviation amount can be performed using known analysis software, for example.

In another embodiment, the positional deviation amount obtained by following Expression 2:

$$\text{Positional deviation amount} = \sqrt{(X_1-X_2)^2 + (Y_1-Y_2)^2} \quad \text{(Expression 2)}$$

can be used as the index. Specifically, when the positional deviation amount obtained by Expression 2 is less than or equal to the threshold value, it can be determined that COPs detected by the above apparatuses are the same COP.

In yet another embodiment, only the coordinate position deviation distance between the detected positions obtained by the apparatuses for the X coordinate position (for example, "$X_2-X_1$" or "$X_1-X_2$"), only the coordinate position deviation distance between the detected positions obtained by the apparatuses for the Y coordinate position (for example, "$Y_2-Y_1$" or "$Y_1-Y_2$"), or the coordinate position deviation distance between the detected positions obtained by the apparatuses for the X coordinate position and the coordinate position deviation distance between the detected positions obtained by the apparatuses for the Y coordinate position can be used as the index. A threshold value can be set for each coordinate position deviation distance. When the distance is less than or equal to the threshold value, the COPs detect by the laser surface inspection apparatus to be calibrated and the apparatus for calibration can be determined to be the same COP.

In the manner described above, among the COPs in the surface of the reference wafer, a plurality of COPs can be determined to be the same COPs detected by both the laser surface inspection apparatus to be calibrated and the apparatus for calibration.

<Calibration Step>

As described above, COPs in the surface of the reference wafer are detected by different apparatuses, and the same COP is determined from the COP detection results obtained by the apparatuses. In the calibration step, as the X coordinate position and the Y coordinate position of the COP determined to be the same COP, the X coordinate position and the Y coordinate position obtained by the apparatus for calibration are adopted as the true values, instead of the coordinate positions obtained by the laser surface inspection apparatus to be calibrated. Then, these true values are used to calibrate the coordinate position identification accuracy of the laser surface inspection apparatus to be calibrated. A specific embodiment of the calibration of the coordinate position identification accuracy can be the determination of the correction values for the X coordinate position and the Y coordinate position of the detected positions obtained by the laser surface inspection apparatus to be calibrated. The correction values can be determined based on the coordinate position deviation distance between the coordinates obtained by the laser surface inspection apparatus to be calibrated and the coordinate positions (true values) obtained by the apparatus for calibration for the same COP. For example, for one COP determined to be the same COP, the coordinate position deviation distance can be obtained from the X coordinate position $X_1$ and the Y coordinate position $Y_1$ obtained by the apparatus for calibration and the X coordinate position $X_2$ and the Y coordinate position $Y_2$ obtained by the laser surface inspection apparatus to be calibrated using the following expressions.

$$X \text{ coordinate position deviation distance} = (X_2 - X_1)$$

$$Y \text{ coordinate position deviation distance} = (Y_2 - Y_1)$$

For example, the X coordinate position deviation distances and the Y coordinate position deviation distances can be obtained for a plurality of COPs, and their representative values (for example, average values, mode values, median values) can be adopted as correction values. A specific example of a correction value determination method is described in Example below.

According to the calibration method described above, it is possible to improve the LPD coordinate position identification accuracy of the laser surface inspection apparatus.

[Semiconductor Wafer Evaluation Method]

One aspect of the present invention relates to a semiconductor wafer evaluation method including: calibrating, by the above calibration method, a coordinate position identification accuracy of a laser surface inspection apparatus that detects LPDs of a semiconductor wafer surface by scanning the wafer surface with incident laser light while rotating the semiconductor wafer; detecting, with the laser surface inspection apparatus after the calibration, an LPD of the semiconductor wafer surface to be evaluated by scanning the wafer surface with incident laser light while rotating the semiconductor wafer to be evaluated; and performing morphological observation on the detected LPD with a microscope, wherein the X coordinate position and the Y coordinate position determined by the laser surface inspection apparatus after the calibration are adopted in determining the observation position of the morphological observation.

The above evaluation method is described in more detail below.

In the above evaluation method, the coordinate position identification accuracy of the laser surface inspection apparatus is calibrated by the calibration method described in detail above. As a result, the laser surface inspection apparatus after calibration can accurately determine the coordinate positions of the defects and/or foreign matter that should be morphologically observed with a microscope.

The laser surface inspection apparatus used in the above evaluation method and the calibration of the coordinate position identification accuracy thereof are as described above. Reference can be made to the above descriptions regarding the detection of LPDs of the surface of the semiconductor wafer to be evaluated by the laser surface inspection apparatus after calibration. Accordingly, the laser surface inspection apparatus after calibration detects defects and/or foreign matter as LPDs, and the coordinate positions thereof are also identified.

Then, a detected LPD is morphologically observed with a microscope. By adopting, in determining the observation position of the morphological observation, the X coordinate position and the Y coordinate position determined by the laser surface inspection apparatus after the calibration, the defect or foreign matter that should be morphologically observed can be checked with a microscope and the morphological observation can be performed. As the microscope, various types of microscopes capable of morphological observation can be used. Specific examples include an atomic force microscope (AFM) and a scanning electron microscope (SEM). As an SEM, scanning electron microscope-energy dispersive x-ray spectroscopy (SEM-EDS) can be used so that element analysis can be performed in addition to morphological observation.

Examples of the semiconductor wafer evaluated by the above-mentioned semiconductor wafer evaluation method include various types of semiconductor wafers such as silicon wafers. The silicon wafer can be a single crystal silicon wafer. Specifically, various types of silicon wafers can be used including a polished wafer obtained by polishing a single crystal silicon wafer, an annealed wafer obtained by forming a modified layer on a single crystal silicon wafer by an annealing treatment, an epitaxial wafer having an epitaxial layer on a single crystal silicon wafer, and a single crystal silicon wafer having a thermally-oxidized film.

EXAMPLE

The present invention is further described with reference to Example. However, the present invention is not limited to the embodiment shown in Example.

In the following Example, as the laser surface inspection apparatus, Surfscan series SP5 manufactured by KLA TENCOR or Surfscan series SP2 manufactured by KLA TENCOR was used. SP5 and SP2 are laser surface inspection apparatuses that detect LPDs of a semiconductor wafer surface by scanning the wafer surface with incident laser light while rotating the semiconductor wafer. In the following Example, the above two types of laser surface inspection apparatuses were used to detect COPs as LPDs by scanning the entire area of one surface of the reference wafer with incident light. Based on the sizes of the LPDs, the analysis portion of each laser surface inspection apparatus performed size conversion to calculate the sizes of the COPs (detection sizes). Regarding the detection sizes, the detection lower limit of SP5 was 19 nm, and the detection lower limit of SP2 was 35 nm. SP5 and SP2 are apparatuses that use a polar coordinate system as the coordinate system for determining the positions of the defects and/or foreign matter detected as LPDs, and convert the positions determined using the polar coordinate system into a two-dimensional Cartesian coordinate system to obtain the X coordinate positions and the Y coordinate positions of the LPDs.

As the apparatus for calibration, MAGICS (M5640) manufactured by Lasertec Corporation was used. MAGICS is a surface defect inspection apparatus (an apparatus that uses a two-dimensional Cartesian coordinate system) equipped with a confocal laser scanning microscope.

(1) Comparison Between COP Detection Results of SP5 and MAGICS

As the reference wafer, a single crystal silicon wafer having COPs in the entire wafer surface was prepared. This wafer was sliced out from a crystal portion in which COPs were present at a high density in almost the entire area in the crystal radial direction.

After cleaning the reference wafer by a known method, measurements were performed with SP5 and MAGICS.

Then, the coordinate position data of SP5 was compared with the coordinate position data of MAGICS, and the positional deviation amounts were obtained from the X coordinate positions and Y coordinate positions of the COPs obtained by the apparatuses using Expression 1 described above. When a positional deviation amount thus obtained was less than or equal to 20 μm, the corresponding COPs were determined to be the same COP.

In the above measurements, SP5 detected about 10,000 COPs, and MAGICS detected about 60,000 COPs. Among them, about 9,800 COPs were determined to be the same COPs (see Table 1).

TABLE 1

Numbers of COPs detected by SP5 and MAGICS

| Number of COPs detected by SP5 | Number of COPs detected by MAGICS | Number of same COPs detected by SP5 and MAGIC |
|---|---|---|
| 10288 | 60473 | 9878 |

Figure 2:
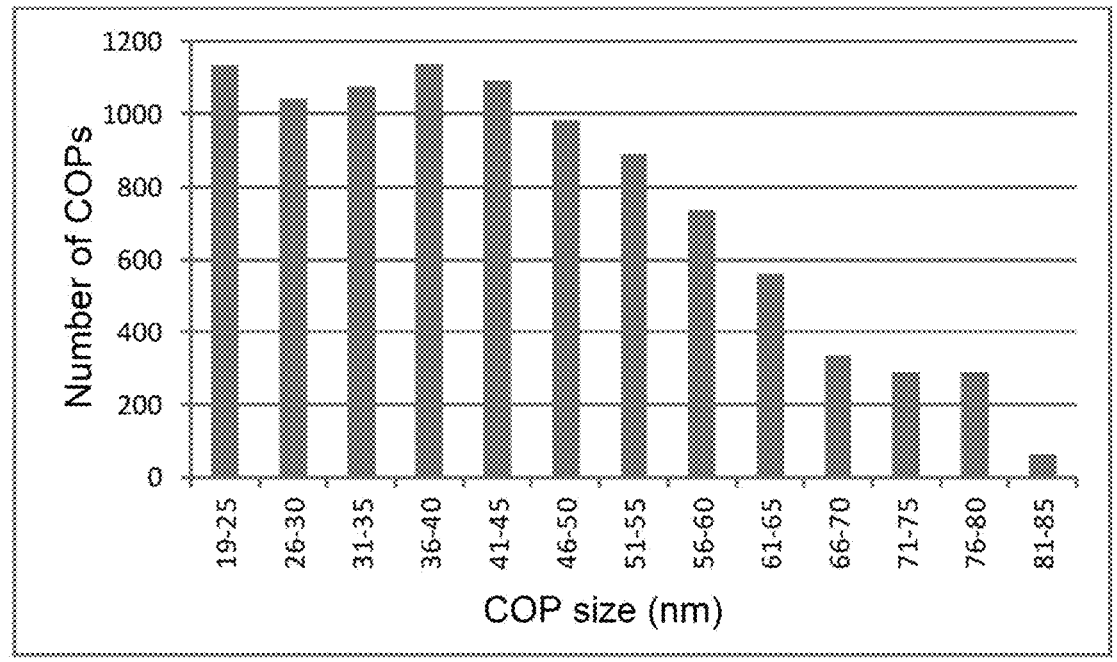
FIG. 2 shows the size distribution measured with Surfscan series SP5 manufactured by KLA TENCOR on the COPs determined to be the same COPs with SP5 and MAGICS (M5640) manufactured by Lasertec Corporation.

FIG. 1 shows the in-plane distribution of the COPs that were determined to be the same COPs with both of the apparatuses. FIG. 2 shows the size distribution measured by SP5 on the COPs determined to be the same COPs with both of the apparatuses.

As can be seen in FIG. 1, the determination regarding the same COPs was possible for COPs distributed over the entire wafer surface. As can be seen in FIG. 2, the determination regarding the same COPs was possible for COPs of various sizes.

(2) Calibration of Coordinate Position Identification Accuracy of SP2

(Apparatus to be Calibrated)

The reference wafer used in (1) above was measured with SP2.

Then, the coordinate data that was determined as the true values described above was compared with the coordinate data of SP2, and the positional deviation amounts were obtained from the X coordinate positions and Y coordinate positions of COPs obtained respectively by the apparatuses using Expression 1 described above. When a positional deviation amount thus obtained was less than or equal to 150 μm, the corresponding COPs were determined to be the same COP.

Figure 3:
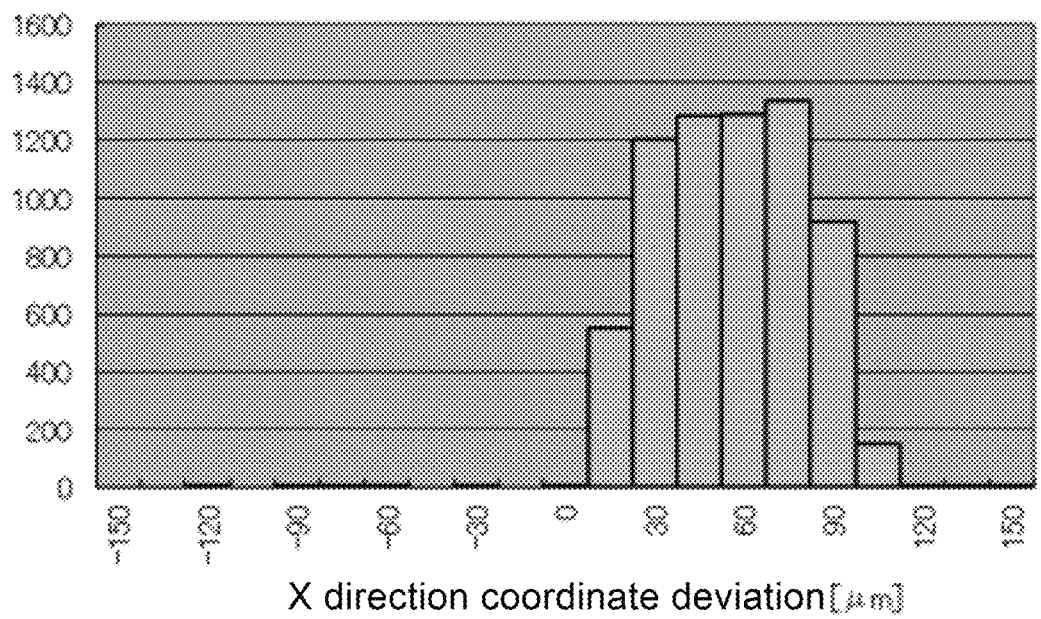
FIG. 3 shows histograms of coordinate position deviation distances between the coordinate positions determined as the true values and the coordinate positions detected by Surfscan series SP2 manufactured by KLA TENCOR obtained in Example for the COPs determined to be the same COPs.
Figure 3:
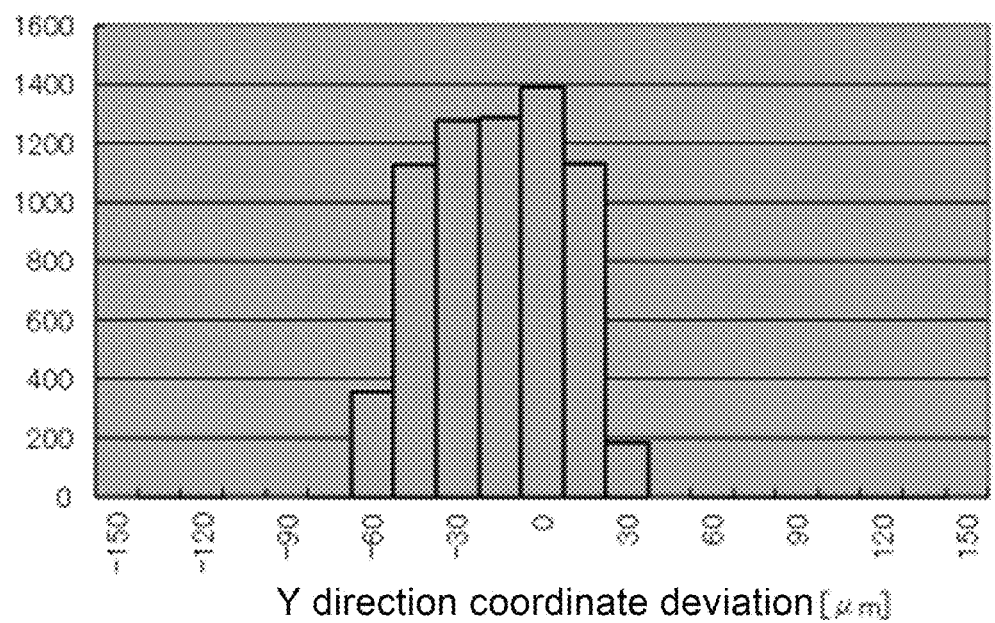

For each of a plurality of COPs thus determined to be the same COPs, the coordinate position deviation distances were calculated using X coordinate position deviation distance=$X_2-X_1$ and Y coordinate position deviation distance=$Y_2-Y_1$ with the coordinate position determined as the true values (i.e., the position coordinates detected by MAGICS) being $(X_1, Y_1)$ and the coordinates detected by SP2 being $(X_2, Y_2)$. FIG. 3 shows histograms of the X coordinate position deviation distances and the Y coordinate position deviation distances. The mode values of the histograms shown in FIG. 3 were adopted as the correction values, the correction value for the X coordinate position was determined to be "+60 μm", and the correction value for the Y coordinate position was determined to be "−10 μm".

(3) Morphological Observation with Microscope

Figure 4:
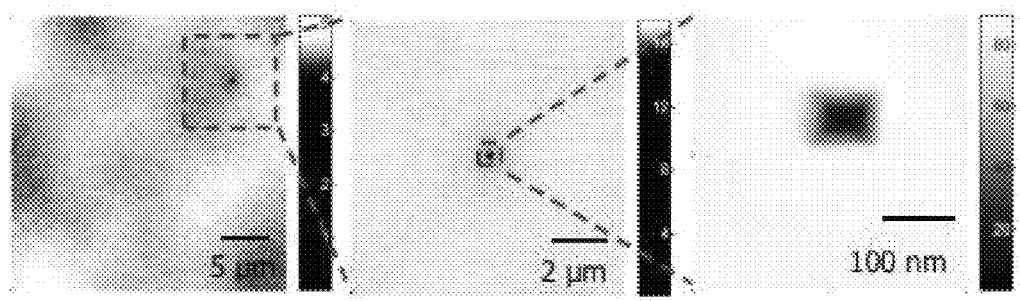
FIG. 4 shows the result of microscopic observation in Example.

The position of the X coordinate and the Y coordinate obtained for a COP that was detected by SP2 as an LPD of the reference wafer surface after the calibration described above was observed with an AFM. The COP was found within the field of view as shown in FIG. 4, and morphological observation could be performed on the COP (Example).

Figure 5:
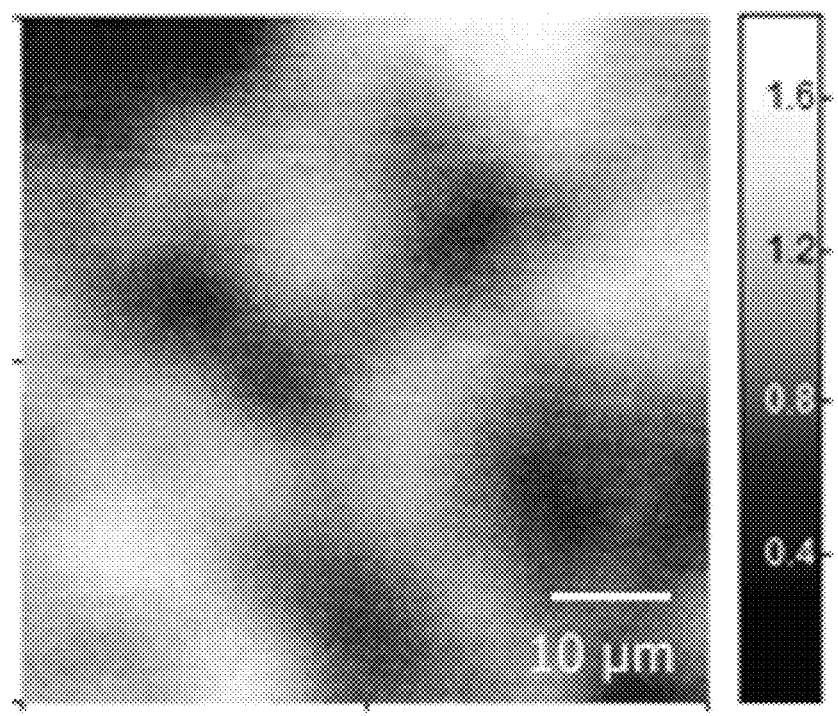
FIG. 5 shows the result of microscopic observation in Comparative Example.

In contrast, when the position of the X coordinate and the Y coordinate of the above COP that was detected by SP2 before calibration was observed with the AFM, it was not possible to find the COP as shown in FIG. 5 (Comparative Example).

The above results indicate that the calibration described above can improve the LPD coordinate position identification accuracy of the laser surface inspection apparatus, and that it is thus possible to morphologically observe the LPDs detected by the laser surface inspection apparatus with a microscope.

One aspect of the present invention is useful in the technical field of various types of semiconductor wafers such as silicon wafers.

The invention claimed is:

1. A method of calibrating a coordinate position identification accuracy of a laser surface inspection apparatus that detects LPDs of a semiconductor wafer surface by scanning the wafer surface with incident laser light while rotating the semiconductor wafer,
which comprises:
detecting a COP in a surface of a reference wafer with each of a laser surface inspection apparatus to be calibrated and an apparatus for calibration that obtains an X coordinate position and a Y coordinate position of the COP with a two-dimensional Cartesian coordinate system;
determining a COP that is detected as the same COP by the laser surface inspection apparatus to be calibrated and the apparatus for calibration with a determination criterion that a positional difference between a detected position obtained by the laser surface inspection apparatus to be calibrated and a detected position obtained by the apparatus for calibration on the reference wafer surface is within a threshold range for determining whether the COP detected respectively by the apparatuses is the same COP; and
calibrating the coordinate position identification accuracy of the laser surface inspection apparatus to be calibrated by adopting the X coordinate position and the Y coordinate position obtained by the apparatus for calibration as true values of the X coordinate position and the Y coordinate position of the COP that is determined to be the same COP, wherein the calibration of the coordinate position identification accuracy includes determining correction values for the X coordinate position and the Y coordinate position of the detected position detected by the laser surface inspection apparatus to be calibrated, wherein, for each of a plurality of COPs, each of which is determined to be the same COP, the coordinate position deviation distance is obtained from the X coordinate position $X_1$ and the Y coordinate position $Y_1$ obtained by the apparatus for calibration, and the X coordinate position $X_2$ and the Y coordinate position $Y_2$ obtained by the laser surface inspection apparatus to be calibrated using the following expressions:

$X$ coordinate position deviation distance=$(X_2-X_1)$, $Y$ coordinate position deviation distance=$(Y_2-Y_1)$, and wherein the X coordinate position deviation distances and the Y coordinate position deviation distances are obtained for the plurality of COPs, and at least one of their respective average values, mode values, or median values is utilized as the correction values.

2. A method of calibrating a coordinate position identification accuracy of a laser surface inspection apparatus that detects LPDs of a semiconductor wafer surface by scanning the wafer surface with incident laser light while rotating the semiconductor wafer, which comprises:

detecting a COP in a surface of a reference wafer with each of a laser surface inspection apparatus to be calibrated and an apparatus for calibration that obtains an X coordinate position and a Y coordinate position of the COP with a two-dimensional Cartesian coordinate system;

determining a COP that is detected as the same COP by the laser surface inspection apparatus to be calibrated and the apparatus for calibration with a determination criterion that a positional difference between a detected position obtained by the laser surface inspection apparatus to be calibrated and a detected position obtained by the apparatus for calibration on the reference wafer surface is within a threshold range for determining whether the COP detected respectively by the apparatuses is the same COP; and calibrating the coordinate position identification accuracy of the laser surface inspection apparatus to be calibrated by adopting the X coordinate position and the Y coordinate position obtained by the apparatus for calibration as true values of the X coordinate position and the Y coordinate position of the COP that is determined to be the same COP, wherein, when a positional deviation amount obtained by following Expression 1:

Positional deviation amount=$\sqrt{(X_2-X_1)^2+(Y_2-Y_1)^2}$ (Expression 1)

is less than or equal to a threshold value, it is determined that the positional difference is within the threshold range, wherein, in Expression 1, $X_1$ and $Y_1$ represent the X coordinate position and the Y coordinate position of the detected position detected by the apparatus for calibration, and $X_2$ and $Y_2$ represent the X coordinate position and the Y coordinate position of the detected position detected by the laser surface inspection apparatus to be calibrated.

3. The method of calibrating a coordinate position identification accuracy of a laser surface inspection apparatus according to claim 1, wherein the apparatus for calibration is a surface defect inspection apparatus equipped with a confocal laser scanning microscope.

4. A method of evaluating a semiconductor wafer, which comprises:

calibrating, by the method of calibrating a coordinate position identification accuracy of a laser surface inspection apparatus according claim 1, a coordinate position identification accuracy of a laser surface inspection apparatus that detects LPDs of a semiconductor wafer surface by scanning the wafer surface with incident laser light while rotating the semiconductor wafer;

detecting, with the laser surface inspection apparatus after the calibration, an LPD of the semiconductor wafer surface to be evaluated by scanning the wafer surface with incident laser light while rotating the semiconductor wafer to be evaluated; and performing morphological observation on the detected LPD with a microscope, wherein an X coordinate position and a Y coordinate position determined by the laser surface inspection apparatus after the calibration are adopted in determining an observation position of the morphological observation.

5. The method of evaluating a semiconductor wafer according to claim 4, wherein the microscope is an atomic force microscope or a scanning electron microscope.

\* \* \* \* \*